(12) United States Patent
Ogasawara

(10) Patent No.: US 10,186,425 B2
(45) Date of Patent: Jan. 22, 2019

(54) METHOD OF MANUFACTURING SEMICONDUCTOR DEVICE AND RESIST GLASS

(71) Applicant: SHINDENGEN ELECTRIC MANUFACTURING CO., LTD., Chiyoda-ku, Tokyo (JP)

(72) Inventor: Atsushi Ogasawara, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/522,870

(22) PCT Filed: Oct. 31, 2014

(86) PCT No.: PCT/JP2014/079150
§ 371 (c)(1),
(2) Date: Apr. 28, 2017

(87) PCT Pub. No.: WO2016/067477
PCT Pub. Date: May 6, 2016

(65) Prior Publication Data
US 2017/0323791 A1    Nov. 9, 2017

(51) Int. Cl.
*H01L 23/29* (2006.01)
*H01L 21/033* (2006.01)
(Continued)

(52) U.S. Cl.
CPC .......... *H01L 21/0332* (2013.01); *C03C 3/091* (2013.01); *C03C 3/093* (2013.01);
(Continued)

(58) Field of Classification Search
CPC .......... H01L 21/0332; H01L 21/31144; H01L 21/28568; H01L 21/0335; H01L 21/0337;
(Continued)

(56) References Cited

U.S. PATENT DOCUMENTS 4,019,248 A * 4/1977 Black .................... H01L 21/314
257/496
4,217,689 A * 8/1980 Fujii .................... H01L 21/3043
125/13.01
(Continued)

FOREIGN PATENT DOCUMENTS

EP         1156020 A1 * 11/2001 ............. C03C 3/089
JP        2004-87955 A     3/2004
(Continued)

OTHER PUBLICATIONS

International Search Report in PCT/JP2014/079150, dated Jan. 20, 2015.

*Primary Examiner* — Latanya N Crawford
(74) *Attorney, Agent, or Firm* — Hauptman Ham, LLP

(57) ABSTRACT

In a method of manufacturing a semiconductor device having an oxide film removing step where an oxide film formed on a surface of a semiconductor substrate is partially removed, the oxide film removing step includes: a first step where a resist glass layer is selectively formed on an upper surface of the oxide film without using an exposure step; a second step where the resist glass layer is densified by baking the resist glass layer; and a third step where the oxide film is partially removed using the resist glass layer as a mask, wherein the resist glass layer is made of resist glass which contains at least $SiO_2$, $B_2O_3$, $Al_2O_3$, and at least two oxides of alkaline earth metals selected from a group consisting of CaO, MgO and BaO, and substantially contains none of Pb, As, Sb, Li, Na, K, and Zn.

3 Claims, 10 Drawing Sheets

(51) Int. Cl.
  *C03C 3/091* (2006.01)
  *C03C 3/093* (2006.01)
  *H01L 21/308* (2006.01)
  *H01L 29/868* (2006.01)
  *C09K 13/08* (2006.01)
  *H01L 21/285* (2006.01)
  *H01L 21/311* (2006.01)
  *H01L 29/66* (2006.01)
  *H01L 29/861* (2006.01)

(52) U.S. Cl.
  CPC .......... *C09K 13/08* (2013.01); *H01L 21/0335* (2013.01); *H01L 21/0337* (2013.01); *H01L 21/28568* (2013.01); *H01L 21/308* (2013.01); *H01L 21/31111* (2013.01); *H01L 21/31144* (2013.01); *H01L 29/66136* (2013.01); *H01L 29/868* (2013.01); *H01L 29/8611* (2013.01); *H01L 29/8613* (2013.01)

(58) Field of Classification Search
  CPC ......... H01L 29/66136; H01L 21/31111; H01L 29/868; H01L 21/308; H01L 29/8613; H01L 29/8611; C03C 3/093; C03C 3/091; C09K 13/08
  See application file for complete search history.

(56) References Cited

U.S. PATENT DOCUMENTS

| | | | | |
|---|---|---|---|---|
| 9,006,113 B2* | 4/2015 | Ogasawara | ............ | C03C 3/066 438/778 |
| 9,099,483 B2* | 8/2015 | Muyari | ................... | C03C 3/066 |
| 9,190,365 B2* | 11/2015 | Ito | ......................... | H01L 23/291 |
| 9,236,318 B1* | 1/2016 | Ito | ............................. | C03C 8/04 |
| 9,318,401 B2* | 4/2016 | Muyari | ................ | H01L 23/291 |
| 2004/0173844 A1* | 9/2004 | Williams | ............ | H01L 29/4236 257/329 |
| 2010/0283108 A1 | 11/2010 | Sawada et al. | | |
| 2013/0075873 A1* | 3/2013 | Ogasawara | ............. | C03C 3/066 257/632 |
| 2013/0154064 A1* | 6/2013 | Ogasawara | ............. | C03C 3/066 257/650 |
| 2014/0312472 A1* | 10/2014 | Ogasawara | ............. | C03C 3/066 257/644 |
| 2014/0339685 A1* | 11/2014 | Muyari | ................... | C03C 3/066 257/650 |
| 2014/0353851 A1* | 12/2014 | Muyari | ................ | H01L 23/291 257/794 |
| 2015/0155244 A1* | 6/2015 | Ito | ......................... | H01L 23/291 257/632 |
| 2016/0002093 A1* | 1/2016 | Ito | ............................. | C03C 8/04 257/644 |

FOREIGN PATENT DOCUMENTS

| | | |
|---|---|---|
| JP | 2004-296770 A | 10/2004 |
| JP | 2010-263129 A | 11/2010 |
| JP | 2012-4444 A | 1/2012 |
| WO | 2013/168238 A1 | 11/2013 |
| WO | 2013/168314 A1 | 11/2013 |
| WO | 2013/168623 A1 | 11/2013 |
| WO | 2014/080935 A1 | 5/2014 |

* cited by examiner

| SPECIMEN | SPECIMEN 1 (EXAMPLE) | SPECIMEN 2 (EXAMPLE) | SPECIMEN 3 (COMPARISON EXAMPLE) |
|---|---|---|---|
| Pb CONTENT (MOL%) | 0 | 0 | 20 |
| ZnO CONTENT (MOL%) | 0 | 4~14 | 0 |
| AVERAGE VALUE OF HEIGHTS OF STEPPED PORTION | 1 OR LESS | 1~2 | 12~15 |
| EVALUATION | good | good | bad |

FIG.6

| ASPECT | | | SPECIMEN 4 (EXAMPLE) | SPECIMEN 5 (EXAMPLE) | SPECIMEN 6 (EXAMPLE) | SPECIMEN 7 (EXAMPLE) | SPECIMEN 8 (COMPARISON EXAMPLE) | SPECIMEN 9 (COMPARISON EXAMPLE) | SPECIMEN 10 (COMPARISON EXAMPLE) |
|---|---|---|---|---|---|---|---|---|---|
| COMPOSITION RATIO (MOLAR RATIO) | | $SiO_2$ | 65.3 | 64.7 | 55.3 | 58.3 | 50.6 | 56.1 | 48.6 |
| | | $B_2O_3$ | 11.8 | 11.7 | 13.5 | 11.7 | 12.4 | 5.6 | 11.9 |
| | | $Al_2O_3$ | 12.6 | 11.9 | 13.8 | 12.0 | 12.6 | 12.4 | 12.1 |
| | | ZnO | 0 | 0 | 4.5 | 9.0 | 14.6 | 14.3 | 14.1 |
| | ALKALINE EARTH METAL | CaO | 6.7 | 5.3 | 7.3 | 2.7 | 4.6 | 5.5 | 5.4 |
| | | MgO | 4.0 | 3.2 | 5.0 | 1.3 | 1.8 | 2.2 | 2.2 |
| | | BaO | 0 | 2.1 | 0 | 5.0 | 2.8 | 3.3 | 3.2 |
| | | NiO | 0 | 0.5 | 0.6 | 0.0 | 0.6 | 0.6 | 0.5 |
| | | $ZrO_2$ | 0 | 0.5 | 0 | 0 | 0 | 0 | 2.0 |
| | | PbO | 0 | 0 | 0 | 0 | 0 | 0 | 0 |
| | | OTHERS | 0 | 0 | 0 | 0 | 0 | 0 | 0 |
| | | TOTAL | 100 | 100 | 100 | 100 | 100 | 100 | 100 |
| EVALUATION ASPECT | EVALUATION ASPECT 1 (BAKING TEMPERATURE) | | good | good | good | good | good | good | good |
| | EVALUATION ASPECT 2 (CHEMICAL RESISTANCE) | | good | good | good | good | bad | bad | bad |
| | EVALUATION ASPECT 3 (AVERAGE LINEAR EXPANSION COEFFICIENT) | | good (3.42) | good (3.42) | good (3.97) | good (3.7) | good (4.09) | bad (4.32) | good (4.23) |
| | EVALUATION ASPECT 4 (INSULATION PROPERTY) | | good | good | good | good | good | good | good |
| COMPREHENSIVE EVALUATION | | | good | good | good | good | bad | bad | bad |

FIG.7

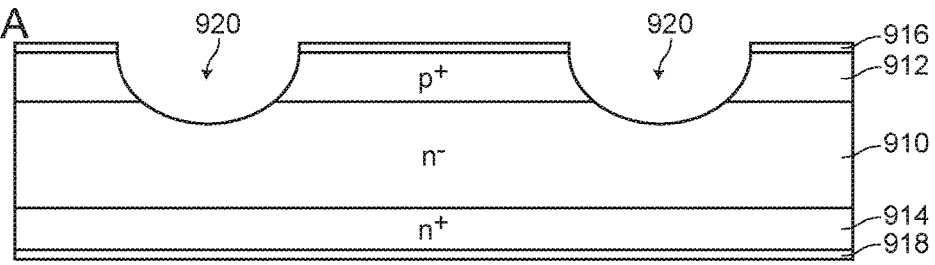
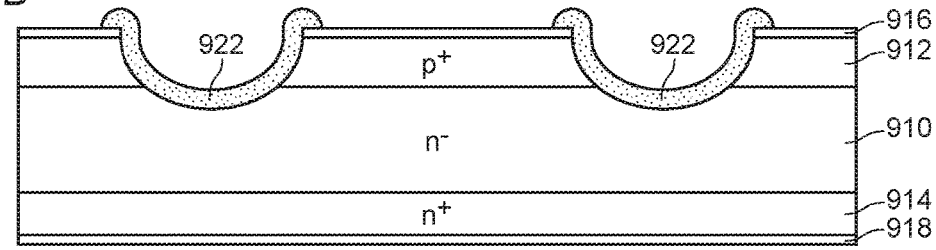
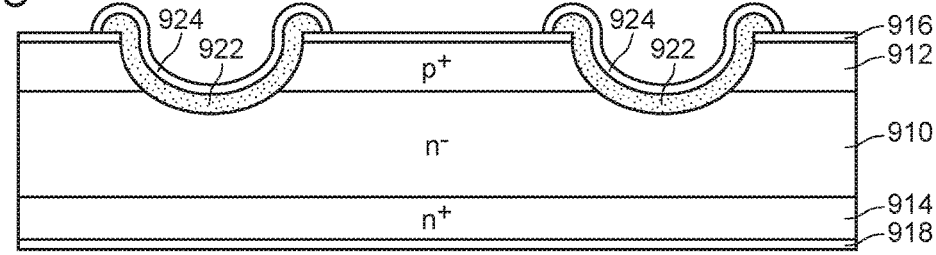
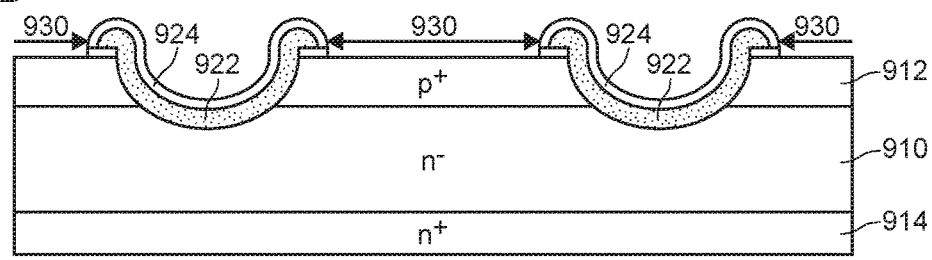
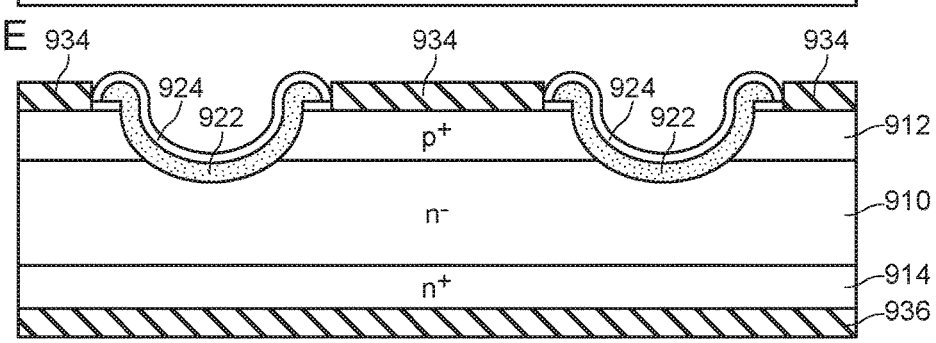

METHOD OF MANUFACTURING SEMICONDUCTOR DEVICE AND RESIST GLASS

RELATED APPLICATIONS

The present application is a National Phase of International Application Number PCT/JP2014/079150, filed Oct. 31, 2014.

TECHNICAL FIELD

The present invention relates to a method of manufacturing a semiconductor device and resist glass.

BACKGROUND ART

Conventionally, there has been known a method of manufacturing a semiconductor device which includes an oxide film removing step where an oxide film formed on a surface of a semiconductor substrate is partially removed (for example, see patent literature 1).

As shown in FIG. 9A to FIG. 9C, the conventional method of manufacturing a semiconductor device includes, in the following order: a semiconductor substrate preparing step (not shown in the drawing) where a semiconductor substrate 910 having a pn junction parallel to a main surface thereof and having the main surface thereof covered by an oxide film 916 is prepared; a trench forming step (see FIG. 9A) where a pn junction exposure portion is formed in the inside of a trench 920 by forming the trench 920 having a depth exceeding the pn junction from one main surface of the semiconductor substrate 910; a glass layer forming step (see FIG. 9B) where a glass layer 922 is formed so as to cover the pn junction exposure portion in the inside of the trench 920; a photoresist layer forming step (see FIG. 9C) where a photoresist layer 924 (made of an organic resist) is formed so as to cover the glass layer 922; an oxide film removing step (see FIG. 9D) where the oxide film 916 formed on the surface of the semiconductor substrate 910 is partially removed by etching using the photoresist layer 924 as a mask; a photoresist layer removing step (not showing the drawing) where the photoresist layer 924 is removed; and an electrode forming step (see FIG. 9E) where an electrode 934 is formed on a portion 930 where an electrode is to be formed.

According to the conventional method of manufacturing a semiconductor device, a glass layer 922 for passivation is formed in the inside of the trench 920 and, thereafter, the semiconductor substrate is cut thus manufacturing a highly reliable mesa-type semiconductor device.

CITATION LIST

Patent Literature

PTL 1: JP-A-2004-87955

SUMMARY OF INVENTION

Technical Problem

However, in the conventional method of manufacturing a semiconductor device, a surface of the glass layer 922 is not flat and hence, variation is liable to be generated with respect to a thickness of the photoresist layer 924 during the photoresist layer forming step (see FIG. 10A). Accordingly, when the photoresist layer 924 is formed with a thin thickness, there has been known a circumstance where an etchant invades the glass layer 922 from a thin portion (a portion surrounded by a broken-line circle A in FIG. 10A) of the photoresist layer 924 during the oxide film removing step thus giving rise to a drawback that the glass layer 922 is corroded by an etchant so that silicon is exposed (see FIG. 10B and FIG. 10C).

Recently, there has been also a circumstance where a method of manufacturing a semiconductor device with high productivity has been demanded in the technical field of a semiconductor device.

The present invention has been made in view of the above-mentioned circumstances, and it is an object of the present invention to provide a method of manufacturing a semiconductor device which can minimize the occurrence of drawbacks such as exposure of silicon during an oxide film removing step and can manufacture a semiconductor device with high productivity. It is another object of the present invention to provide resist glass which is used in such a method of manufacturing a semiconductor device.

Solution to Problem

[1] A method of manufacturing a semiconductor device according to the present invention is a method of manufacturing a semiconductor device which includes an oxide film removing step where an oxide film formed on a surface of a semiconductor substrate is partially removed, wherein the oxide film removing step includes: a first step where a resist glass layer is selectively formed on an upper surface of the oxide film without using an exposure step; a second step where the resist glass layer is densified by baking the resist glass layer; and a third step where the oxide film is partially removed using the resist glass layer as a mask, wherein the resist glass layer is made of resist glass which contains at least $SiO_2$, $B_2O_3$, $Al_2O_3$, and at least two oxides of alkaline earth metals selected from a group consisting of CaO, MgO and BaO, and substantially contains none of Pb, As, Sb, Li, Na, K, and Zn.

[2] In the method of manufacturing a semiconductor device according to the present invention, it is preferable that, in the resist glass, the content of $SiO_2$ fall within a range of from 58 mol % to 72 mol %, the content of $B_2O_3$ fall within a range of from 7 mol % to 17 mol %, the content of $Al_2O_3$ fall within a range of from 7 mol % to 17 mol %, and the content of the oxide of the alkaline earth metal fall within a range of from 6 mol % to 16 mol %.

[3] A method of manufacturing a semiconductor device according to the present invention is a method of manufacturing a semiconductor device including an oxide film removing step where an oxide film formed on a surface of a semiconductor substrate is partially removed, wherein the oxide film removing step includes: a first step where a resist glass layer is selectively formed on an upper surface of the oxide film without using an exposure step; a second step where the resist glass layer is densified by baking the resist glass layer; and a third step where the oxide film is partially removed using the resist glass layer as a mask, wherein the resist glass layer contains at least $SiO_2$, $B_2O_3$, $Al_2O_3$, ZnO, and at least two oxides of alkaline earth metals selected from a group consisting of CaO, MgO and BaO, and substantially contains none of Pb, As, Sb, Li, Na and K, and the content of $SiO_2$ falls within a range of from 50 mol % to 65 mol %, the content of $B_2O_3$ falls within a range of from 8 mol % to 18 mol %, the content of $Al_2O_3$ falls within a range of from 4 mol % to 15 mol %, the content of ZnO falls within a range of from 4 mol % to 14 mol %, and the content of the oxide of the alkaline earth metal falls within a range of from 6 mol % to 16 mol %.

[4] In the method of manufacturing a semiconductor device of the present invention, it is preferable that the method do not include the step of removing the resist glass layer after the oxide film removing step.

[5] In the method of manufacturing a semiconductor device of the present invention, it is preferable that, in the third step, the oxide film be removed by using an etchant containing a hydrofluoric acid.

[6] In the method of manufacturing a semiconductor device of the present invention, it is preferable that the method further include in the following order before the oxide film removing step: a semiconductor substrate preparing step where a semiconductor substrate having a pn junction parallel to a main surface thereof and having the main surface thereof covered by an oxide film is prepared; and a trench forming step where a pn junction exposure portion is formed in the inside of the trench by forming the trench having a depth exceeding the pn junction from one main surface of the semiconductor substrate, wherein in the first step, the resist glass layer is formed on a region of an upper surface of the oxide film around the trench and on an inner surface of the trench by an electrophoresis method, in the third step, the oxide film is removed using the resist glass layer as a mask, and the method further comprises an electrode forming step where an electrode is formed in the region where the oxide film is removed in the third step after the oxide film removing step.

[7] In the method of manufacturing a semiconductor device of the present invention, it is preferable that the method further include in the following order before the oxide film removing step: a step where the semiconductor substrate which has a pn junction exposure portion where a pn junction is exposed on a surface thereof is prepared; and a step where the oxide film is formed on the surface of the semiconductor substrate, wherein in the first step, the resist glass layer is formed in a region of an upper surface of the oxide film which covers the pn junction exposure portion by way of the oxide film by a screen printing method, in the third step, the oxide film is removed using the resist glass layer as a mask, and the method further comprises an electrode forming step where an electrode is formed in the region where the oxide film is removed in the third step after the oxide film removing step.

[8] Resist glass of the present invention is resist glass which contains: at least $SiO_2$, $B_2O_3$, $Al_2O_3$, ZnO, and at least two oxides of alkaline earth metals selected from a group consisting of CaO, MgO and BaO, and substantially contains none of Pb, As, Sb, Li, Na and K.

[9] Resist glass of the present invention is resist glass which contains: at least $SiO_2$, $B_2O_3$, $Al_2O_3$, and at least two oxides of alkaline earth metals selected from a group consisting of CaO, MgO and BaO, and substantially contains none of Pb, As, Sb, Li, Na, K and Zn, wherein the content of $SiO_2$ falls within a range of from 50 mol % to 65 mol %, the content of $B_2O_3$ falls within a range of from 8 mol % to 18 mol %, the content of $Al_2O_3$ falls within a range of from 4 mol % to 15 mol %, the content of ZnO falls within a range of from 4 mol % to 14 mol %, and the content of the oxide of the alkaline earth metal falls within a range of from 6 mol % to 16 mol %.

Advantageous Effects of Invention

According to the method of manufacturing a semiconductor device of the present invention, the resist glass layer is made of the resist glass described in the above-mentioned [1] (that is, the resist glass which does not substantially contain Zn) or the resist glass described in the above-mentioned [3] (that is, the resist glass where the content of ZnO falls within a range of from 4 mol % to 14 mol %). Accordingly, as can be also understood from a test example 1 described later, it is possible to form the resist glass layer which exhibits high resistance against an etchant. As a result, the method of manufacturing a semiconductor device of the present invention becomes a method of manufacturing a semiconductor device which can minimize the occurrence of drawbacks such as the exposure of silicon during the oxide film removing step.

According to the method of manufacturing a semiconductor device of the present invention, the resist glass layer is made of the resist glass described in the above-mentioned [1] (that is, the resist glass which does not substantially contain Zn) or the resist glass described in the above-mentioned [3] (that is, the resist glass where the content of ZnO falls within a range of from 4 mol % to 14 mol %). Accordingly, as can be also understood from a test example 2 described later, the resist glass layer which is used as the mask in the oxide film removing step can be used as a glass layer for passivation as it is and hence, a step of removing the resist glass layer becomes unnecessary. As a result, it is possible to manufacture a semiconductor device with high productivity.

Further, according to the method of manufacturing a semiconductor device of the present invention, in the first step, the resist glass layer is formed without using the exposure step and hence, the exposure step becomes unnecessary. As a result, the method of manufacturing a semiconductor device of the present invention can manufacture a semiconductor device with high productivity also from this viewpoint.

As a result, according to the method of manufacturing a semiconductor device of the present invention, the occurrence of drawbacks such as the exposure of silicon can be minimized during the oxide film removing step and, at the same time, a semiconductor device can be manufactured with high productivity.

Still further, according to the method of manufacturing a semiconductor device of the present invention, the resist glass layer is made of the resist glass described in the above-mentioned [1] or the above-mentioned [3] (that is, the resist glass which does not substantially contain Pb) and hence, there is no possibility that Pb elutes from the resist glass layer due to an etchant during the oxide film removing step. Accordingly, Pb does not adhere to a portion where an electrode is to be formed and hence, the electrode can be easily formed during an electrode forming step which comes after the oxide film removing step.

The resist glass of the present invention is the resist glass described in the above-mentioned [8] (that is, the resist glass which does not substantially contain Zn) or is the resist glass described in the above-mentioned [9] (that is, the resist glass where the content of ZnO falls within a range of from 4 mol % to 14 mol %). Accordingly, as can be also understood from the test example 1 described later, by using this resist glass during steps of manufacturing a semiconductor device, it is possible to form the resist glass layer which exhibits high resistance against an etchant. As a result, the resist glass of the present invention becomes resist glass which can minimize the occurrence of drawbacks such as the exposure of silicon during the oxide film removing step when this resist glass is used during the steps of manufacturing a semiconductor device.

The resist glass of the present invention is the resist glass described in the above-mentioned [8] (that is, the resist glass which does not substantially contain Zn) or is the resist glass described in the above-mentioned [9] (that is, the resist glass where the content of ZnO falls within a range of from 4 mol % to 14 mol %). Accordingly, as can be also understood from the test example 2 described later, by using this resist glass during the steps of manufacturing a semiconductor device, the resist glass layer can be used as a glass layer for passivation as it is and hence, a step of removing the resist glass layer becomes unnecessary. As a result, the resist glass of the present invention becomes resist glass which enables the manufacture of a semiconductor device with high productivity.

Further, according to the resist glass of the present invention, with the use of the resist glass of the present invention in the steps of manufacturing the semiconductor device, the resist glass layer can be formed by an electrophoresis method or a screen printing method without using an exposure step and hence, the exposure step becomes unnecessary. As a result, the resist glass of the present invention becomes resist glass which enables the manufacture of a semiconductor device with high productivity also from this viewpoint.

As a result, the resist glass of the present invention becomes resist glass which can minimize the occurrence of drawbacks such as the exposure of silicon during the oxide film removing step and which enables the manufacture of a semiconductor device with high productivity when this resist glass is used during the steps of manufacturing a semiconductor device.

The resist glass of the present invention is the resist glass described in the above-mentioned [8] or the above-mentioned [9] (that is, the resist glass which does not substantially contain Pb) and hence, with the use of this resist glass in the steps of manufacturing a semiconductor device, there is no possibility that Pb elutes from the resist glass layer due to an etchant during the oxide film removing step. Accordingly, Pb does not adhere to a portion where an electrode is to be formed and hence, the electrode can be easily formed during an electrode forming step which comes after the oxide film removing step.

In the present invention, "contains at least certain specified components ($SiO_2$, $B_2O_3$, $Al_2O_3$ and the like" means not only that only these certain specified components are contained but also that components which are usually contained in glass are also contained besides the certain specified components.

In the present invention, "substantially contains none of certain specified elements (Pb, As, Sb and the like)" means that the certain specific elements are not contained as components. That is, "substantially contains none of specified elements (Pb, As, Sb and the like)" does not exclude resist glass where the above-mentioned specified elements are mixed into raw materials of the respective components which form resist glass as impurities.

Further, in the present invention, "contains none of certain specified elements (Pb, As, Sb and the like)" means that oxides of these certain specified elements, nitrides of these certain specified elements and the like are not contained.

BRIEF DESCRIPTION OF THE DRAWINGS

FIG. 3A and FIG. 3B are views for describing effects of the method of manufacturing a semiconductor device according to the embodiment 1, wherein FIG. 3A is a view showing a state immediately before a third step is performed in an oxide film removing step, and FIG. 3B is a view showing a state immediately after the third step is performed in the oxide film removing step.

FIG. 6 is a table showing data of respective specimens used in a test example 1 and an evaluation result of the test example 1.

FIG. 7 is a table showing data of respective specimens used in a test example 2 and an evaluation result of the test example 2.

FIG. 8A and FIG. 8B are graphs showing a reverse voltage characteristic of the semiconductor devices, wherein FIG. 8A is the graph showing the reverse voltage characteristic of a specimen 4 (example), and FIG. 8B is the graph showing the reverse voltage characteristic of a specimen 5 (example), FIG. 9A to FIG. 9E are views for describing a conventional method of manufacturing a semiconductor device, and are also views showing respective steps of the method of manufacturing a semiconductor device.

FIG. 10A and FIG. 10C are views for describing drawbacks of the conventional method of manufacturing a semiconductor device, wherein FIG. 10A is a view showing a state immediately after a photoresist forming step is carried out, FIG. 10C is a view immediately after a photo resist removing step is carried out.

MODE FOR CARRYING OUT THE INVENTION

Figure 1A:
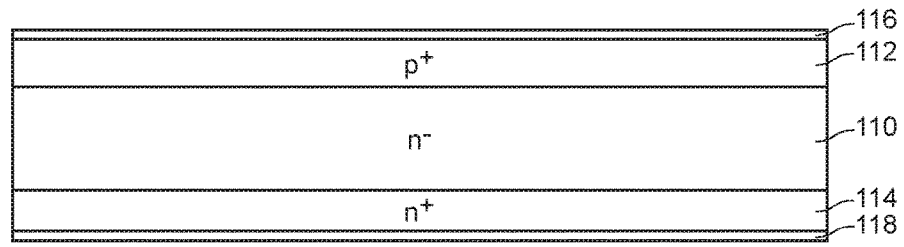
FIG. 1A to FIG. 1D are views for describing a method of manufacturing a semiconductor device according to an embodiment 1, and are also views showing respective steps of the method of manufacturing a semiconductor device.
Figure 1B:
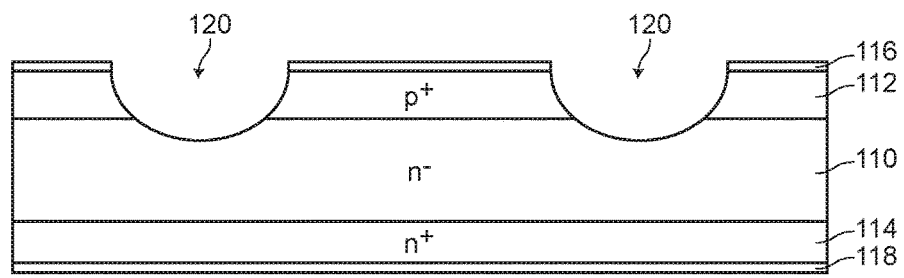

Hereinafter, a method of manufacturing a semiconductor device and resist glass of the present invention are described in conjunction with embodiments shown in the drawings.

Embodiment 1

In a method of manufacturing a semiconductor device according to an embodiment 1, as shown in FIG. 1A to FIG. 1D and FIG. 2A to FIG. 2D, a semiconductor substrate preparing step, a trench forming step, an oxide film removing step, a roughened surface region forming step, an electrode forming step, and a semiconductor substrate cutting step are performed in this order. Hereinafter, the method of manufacturing a semiconductor device according to the embodiment 1 is described in the order of these steps.

(a) Semiconductor Substrate Preparing Step

First, a $p^+$ type semiconductor layer 112 is formed on an $n^-$ type semiconductor substrate ($n^-$ type silicon substrate) 110 by diffusion of a p type dopant from one surface of the $n^-$ type semiconductor substrate 110, and an $n^+$ type semiconductor layer 114 is formed on the $n^-$ type semiconductor substrate 110 by diffusion of an n type dopant from the other surface of the n⁻ type semiconductor substrate 110 thus forming a semiconductor substrate where a pn junction parallel to a main surface of the semiconductor substrate is formed. Thereafter, oxide films 116, 118 are formed by thermal oxidation on a surface of the p⁺ type semiconductor layer 112 and a surface of the n⁺ type semiconductor layer 114 respectively (see FIG. 1A).

(b) Trench Forming Step

Next, predetermined opening portions are formed in predetermined regions on the oxide film 116 by photo etching. After the oxide film is etched, subsequently, the semiconductor substrate is etched thus forming trenches 120 having a depth exceeding the pn junction from one surface of the semiconductor substrate (see FIG. 1B). With such operations, a pn junction exposure portion is formed in the inside of the trenches 120.

(c) Oxide Film Removing Step

Next, the oxide film 116 formed on the surface of the semiconductor substrate 110 is partially removed. The oxide film removing step includes, in the following order: a first step where a resist glass layer 124 is formed; a second step where the resist glass layer 124 is densified; and a third step where the oxide film 116 is partially removed using the resist glass layer 124 as a mask. The method of manufacturing a semiconductor device according to the embodiment 1 does not include a step of removing the resist glass layer 124 after the oxide film removing step, and the resist glass layer 124 is used as glass for passivation as it is.

(c-1) First Step

Figure 1C:
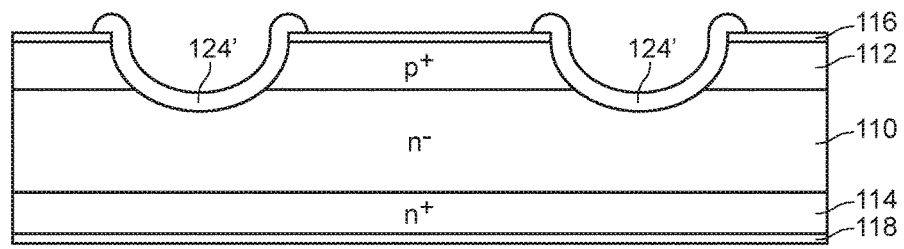

First, the resist glass layer 124 is formed on regions of an upper surface of the oxide film 116 around the trenches and on inner surfaces of the trenches without using an exposure step by an electrophoresis method (see FIG. 1C). Accordingly, the pn junction exposure portion in the inside of each trench 120 is brought into a state where the pn junction exposure portion is directly covered by the resist glass layer 124.

The resist glass layer 124 is made of resist glass which contains at least $SiO_2$, $B_2O_3$, $Al_2O_3$, and at least two oxides of alkaline earth metals selected from a group consisting of CaO, MgO and BaO, and substantially contains none of Pb, As, Sb, Li, Na, K, and Zn. To be more specific, the resist glass layer 124 is made of resist glass which is formed using fine glass particles prepared from a material in a molten state obtained by melting the above-mentioned raw materials, and does not contain any component of the above-mentioned raw materials as a filler.

In the resist glass, the content of $SiO_2$ falls within a range of from 58 mol % to 72 mol %, the content of $B_2O_3$ falls within a range of from 7 mol % to 17 mol %, the content of $Al_2O_3$ falls within a range of from 7 mol % to 17 mol %, and the content of the oxide of the alkaline earth metal falls within a range of from 6 mol % to 16 mol %.

(c-2) Second Step

Figure 1D:
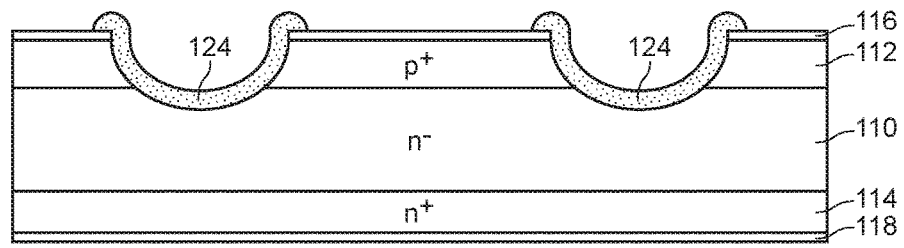

Next, the resist glass layer 124 is densified by baking the resist glass layer 124 under a predetermined temperature condition (see FIG. 1D).

(c-3) Third Step

Figure 2A:
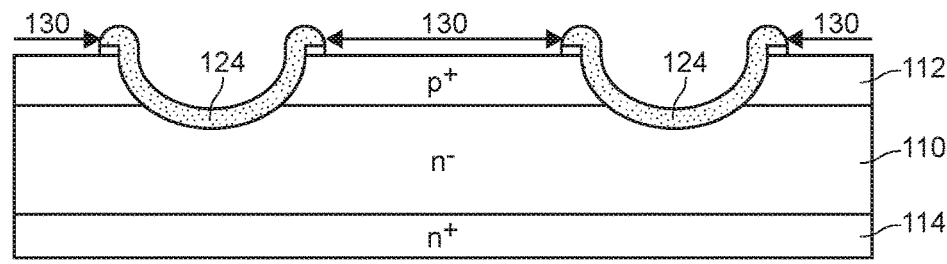
FIG. 2A to FIG. 2D are views for describing the method of manufacturing a semiconductor device according to the embodiment 1, and are also views showing respective steps of the method of manufacturing a semiconductor device.

Next, using the resist glass layer 124 as the mask, the oxide film 116 on regions other than the regions around the trenches on an upper surface of the oxide film 116 (in regions 130 where a Ni plating electrode film is to be formed) is removed (see FIG. 2A). In the third step, the oxide film 116 is removed using an etchant containing hydrofluoric acid (for example, buffered hydrofluoric acid).

(d) Roughened Surface Region Forming Step

Figure 2B:
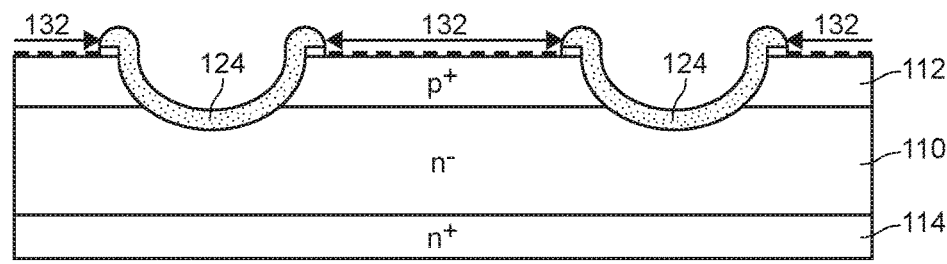

Next, surface roughening treatment is applied to a surface of the semiconductor substrate 110 in the regions where the oxide film 116 is removed in the oxide film removing step (the regions 130 on which the Ni plating electrode film is to be formed) thus forming a roughened surface region 132 for increasing adhesion between an Ni plating electrode and the semiconductor substrate (see FIG. 2B).

(e) Electrode Forming Step

Figure 2C:
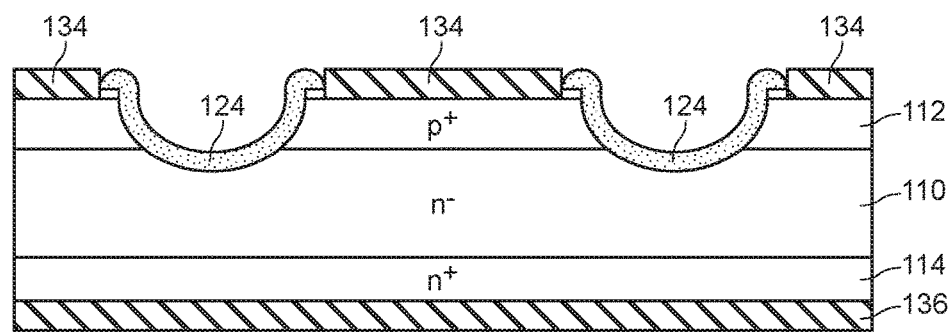

Next, an Ni plating is applied to the semiconductor substrate thus forming an anode electrode 134 on the roughened surface regions 132 (the regions from which the oxide film 116 is removed in the third step), and forming a cathode electrode 136 on the other surface of the semiconductor substrate 110 (see FIG. 2C).

(f) Semiconductor Substrate Cutting Step

Figure 2D:
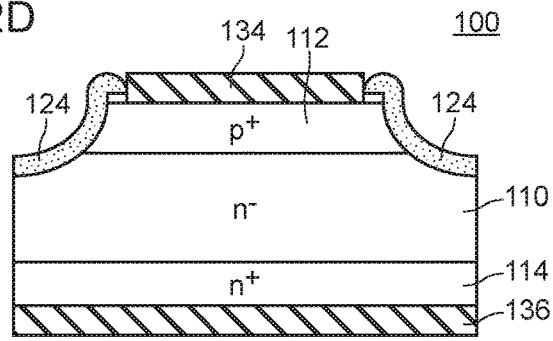

Next, the semiconductor substrate is cut by dicing or the like at the center portion of each resist glass layer 124 so that the semiconductor substrate is divided into a plurality of chips thus manufacturing mesa-type semiconductor elements (pn diodes) 100 (see FIG. 2D).

Through the above-mentioned steps, the semiconductor device 10 according to the embodiment 1 can be manufactured.

Figure 10A:
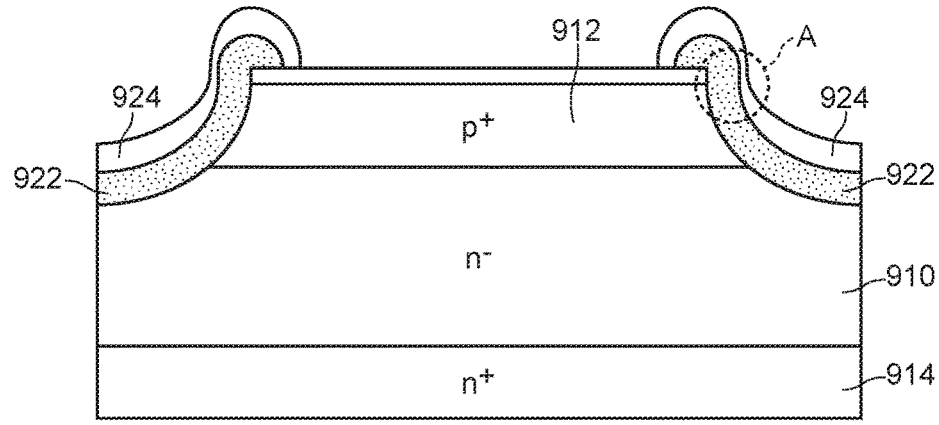

According to the method of manufacturing a semiconductor device of the embodiment 1, the resist glass layer 124 is made of the above-mentioned resist glass (that is, the resist glass which does not substantially contain Zn). Accordingly, as can be also understood from the result of a specimen 1 of a test example 1 described later, it is possible to form the resist glass layer which exhibits high resistance against an etchant. As a result, the method of manufacturing a semiconductor device according to the embodiment 1 becomes a method of manufacturing a semiconductor device which can minimize the occurrence of drawbacks (see a portion surrounded by a broken-line circle A in FIG. 10A to FIG. 10C) such as the exposure of silicon during the oxide film removing step.

According to the method of manufacturing a semiconductor device of the embodiment 1, the resist glass layer 124 is made of the above-mentioned resist glass. Accordingly, as can be also understood from the results of specimens 4 and 5 of a test example 2 described later, the resist glass layer 124 can be used as a glass layer for passivation as it is in the oxide film removing step and hence, a step of removing the resist glass layer 124 becomes unnecessary. As a result, it is possible to manufacture a semiconductor device with high productivity.

According to the method of manufacturing a semiconductor device of the embodiment 1, in the first step, the resist glass layer 124 is formed without using the exposure step and hence, the exposure step becomes unnecessary. As a result, the method of manufacturing a semiconductor device according to the embodiment 1 can manufacture a semiconductor device with high productivity also from this viewpoint.

As a result, according to the method of manufacturing a semiconductor device of the embodiment 1, the occurrence of drawbacks such as the exposure of silicon can be minimized during the oxide film removing step and, at the same time, a semiconductor device can be manufactured with high productivity.

According to the method of manufacturing a semiconductor device of the embodiment 1, the resist glass layer 124 is made of the above-mentioned resist glass (that is, the resist glass which does not substantially contain Pb) and hence, there is no possibility that Pb elutes from the resist glass layer 124 due to an etchant used in the oxide film removing step (third step). Accordingly, Pb does not adhere to the portions 130 where an electrode is to be formed and hence, the electrode can be easily formed during an electrode forming step which comes after the oxide film removing step.

According to the method of manufacturing a semiconductor device of the embodiment 1, in the resist glass, the content of $SiO_2$ falls within a range of from 58 mol % to 72 mol %, the content of $B_2O_3$ falls within a range of from 7 mol % to 17 mol %, the content of $Al_2O_3$ falls within a range of from 7 mol % to 17 mol %, and the content of the oxide of the alkaline earth metal falls within a range of from 6 mol % to 16 mol %. Accordingly, as can be also understood from the results of the specimens 4 and 5 of the test example 2 described later, the resist glass layer 124 becomes a glass layer for passivation having excellent properties (for example, a glass layer which can be baked at a proper temperature, exhibits resistance against chemicals used in the steps, has a linear expansion coefficient close to a linear expansion coefficient of silicon for preventing warping of a wafer during the steps, and has excellent insulation property).

According to the method of manufacturing a semiconductor device of the embodiment 1, the method does not include the step of removing the resist glass layer after the oxide film removing step and hence, a semiconductor device can be manufactured with higher productivity.

According to the method of manufacturing a semiconductor device of the embodiment 1, in the third step, the oxide film 116 is removed using an etchant containing hydrofluoric acid and hence, the oxide film 116 can be efficiently removed. The resist glass layer 124 is made of the above-mentioned resist glass and hence, the resist glass layer 124 exhibits high resistance against an etchant containing hydrofluoric acid. Accordingly, the method of manufacturing a semiconductor device according to the embodiment 1 becomes a method of manufacturing a semiconductor device which can minimize the occurrence of drawbacks such as exposure of silicon during the oxide film removing step even when the oxide film 116 is removed using an etchant containing hydrofluoric acid in the third step.

Figure 3A:
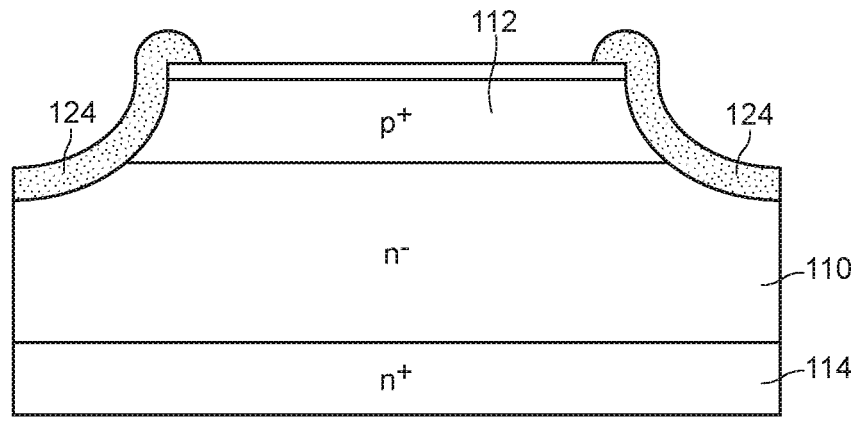
Figure 3B:
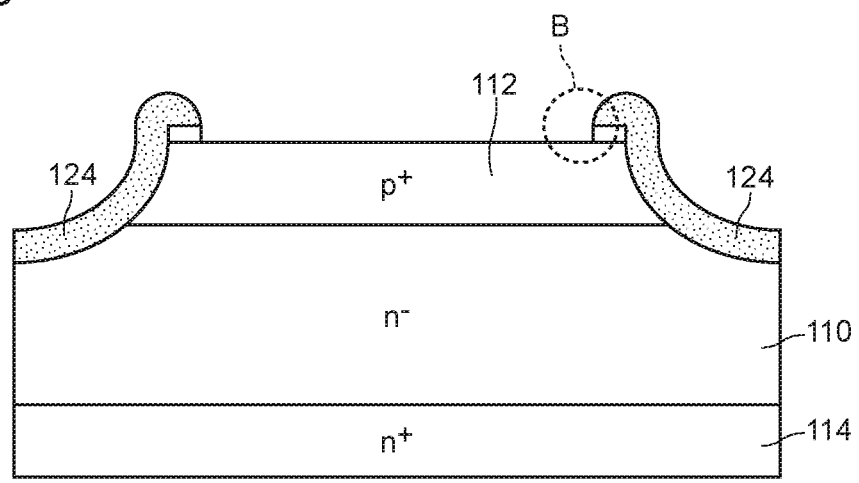
Figure 10B:
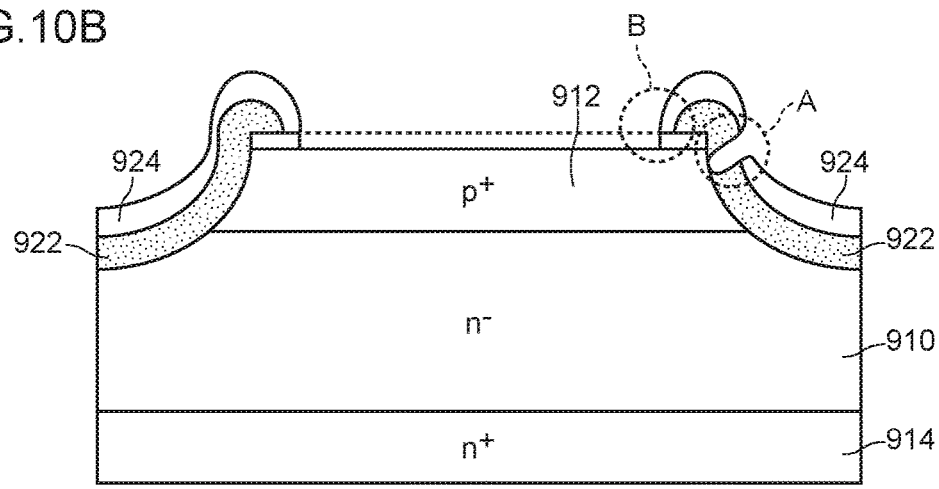
FIG. 10B is a view showing a state immediately after an oxide film removing step is carried out.
Figure 10C:
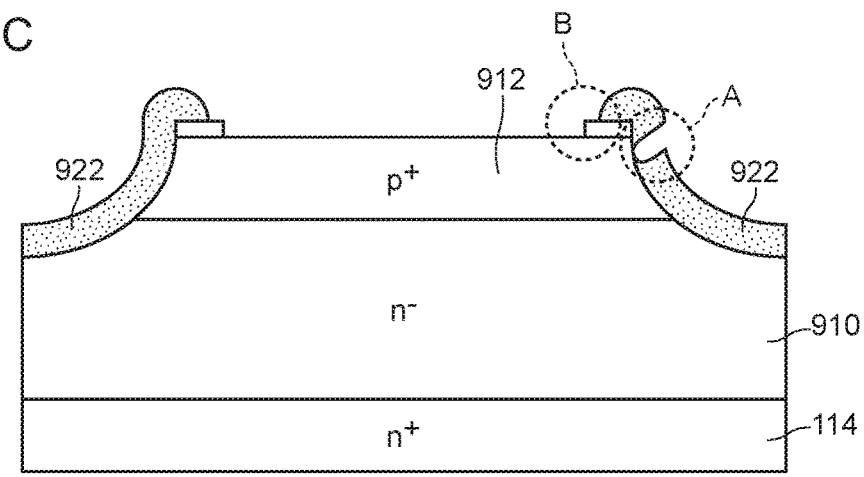

In the conventional method of manufacturing a semiconductor device, an oxide film is removed using a photoresist layer 924 as a mask and hence, it is difficult to remove a portion of the oxide film in the vicinity of an end portion of the glass layer 922 (see a portion surrounded by a broken-line circle B in FIG. 10B and FIG. 10C). However, according to the method of manufacturing a semiconductor device of the embodiment 1, in the first step, the resist glass layer is formed on the regions of the upper surface of the oxide film around the trenches and the inner surfaces of the trenches by an electrophoresis method and, in the third step, the oxide film is removed using the resist glass layer as the mask and hence, the oxide film ranging to an end portion of the resist glass layer 124 can be removed (see a region surrounded by a broken-line circle B in FIG. 3B). Accordingly, compared to a semiconductor device manufactured by the conventional method of manufacturing a semiconductor device, an electrode having a larger area can be formed and, as a result, a semiconductor device having favorable forward characteristics can be manufactured.

The resist glass according to the embodiment 1 is the above-mentioned resist glass (that is, the resist glass which does not substantially contain Zn). Accordingly, as can be also understood from the test example 1 described later, by using this resist glass during steps of manufacturing a semiconductor device, it is possible to form the resist glass layer 124 which exhibits high resistance against an etchant. As a result, the resist glass according to the embodiment 1 becomes resist glass which can minimize the occurrence of drawbacks such as the exposure of silicon during the oxide film removing step when this resist glass is used during the steps of manufacturing a semiconductor device.

The resist glass according to the embodiment 1 is the above-mentioned resist glass. Accordingly, as can be also understood from the results of the specimens 4 and 5 of the test example 2 described later, by using this resist glass during the steps of manufacturing a semiconductor device, the resist glass layer 124 can be used as a glass layer for passivation as it is and hence, a step of removing the resist glass layer 124 becomes unnecessary. As a result, the resist glass according to the embodiment 1 becomes resist glass which enables the manufacture of a semiconductor device with high productivity.

According to the resist glass according to the embodiment 1, with the use of the resist glass according to the embodiment 1 in the steps of manufacturing the semiconductor device, the resist glass layer can be formed by an electrophoresis method or a screen printing method without using an exposure step and hence, the exposure step becomes unnecessary. As a result, the resist glass according to the embodiment 1 becomes resist glass which enables the manufacture of a semiconductor device with high productivity also from this viewpoint.

As a result, the resist glass according to the embodiment 1 becomes resist glass which can minimize the occurrence of drawbacks such as the exposure of silicon during the oxide film removing step and which enables the manufacture of a semiconductor device with high productivity when this resist glass is used during the steps of manufacturing a semiconductor device.

The resist glass according to the embodiment 1 is the above-mentioned resist glass (that is, the resist glass which does not substantially contain Pb) and hence, with the use of this resist glass in the steps of manufacturing a semiconductor device, there is no possibility that Pb elutes from the resist glass layer due to an etchant during the oxide film removing step. Accordingly, Pb does not adhere to a portion where an electrode is to be formed and hence, the electrode can be easily formed during an electrode forming step which comes after the oxide film removing step.

Embodiment 2

A method of manufacturing a semiconductor device according to an embodiment 2 basically includes substantially the same steps as the method of manufacturing a semiconductor device according to the embodiment 1. However, the method of manufacturing a semiconductor device according to the embodiment 2 differs from the method of manufacturing a semiconductor device according to the embodiment 1 with respect to the composition of a resist glass layer. That is, in the method of manufacturing a semiconductor device according to the embodiment 2, the resist glass layer is made of resist glass where the content of ZnO falls within a range of from 4 mol % to 14 mol %. To be more specific, the resist glass layer is made of resist glass which contains at least $SiO_2$, $B_2O_3$, $Al_2O_3$, ZnO, and at least two oxides of alkaline earth metals selected from a group consisting of CaO, MgO and BaO, and substantially contains none of Pb, As, Sb, Li, Na and K, and the content of $SiO_2$ falls within a range of from 50 mol % to 65 mol %, the content of $B_2O_3$ falls within a range of from 8 mol % to 18 mol %, the content of $Al_2O_3$ falls within a range of from 4 mol % to 15 mol %, the content of ZnO falls within a range of from 4 mol % to 14 mol %, and the content of the oxide of the alkaline earth metal falls within a range of from 6 mol % to 16 mol %.

As described above, the method of manufacturing a semiconductor device according to the embodiment 2 differs from the method of manufacturing a semiconductor device according to the embodiment 1 with respect to the composition of the resist glass layer. However, the resist glass layer is made of the above-mentioned resist glass (that is, the resist glass where the content of ZnO falls within a range of from 4 mol % to 14 mol %). Accordingly, as can be also understood from the result of a specimen 2 of a test example 1 described later, it is possible to form the resist glass layer which exhibits high resistance against an etchant in the same manner as the method of manufacturing a semiconductor device according to the embodiment 1. As a result, the method of manufacturing a semiconductor device according to the embodiment 2 becomes a method of manufacturing a semiconductor device which can minimize the occurrence of drawbacks such as the exposure of silicon during the oxide film removing step.

According to the method of manufacturing a semiconductor device of the embodiment 2, the resist glass layer is made of the above-mentioned resist glass. Accordingly, as can be also understood from the results of specimens 6 and 7 of a test example 2 described later, the resist glass layer can be used as a glass layer for passivation as it is in the oxide film removing step and hence, a step of removing the resist glass layer becomes unnecessary. As a result, it is possible to manufacture a semiconductor device with high productivity.

The method of manufacturing a semiconductor device according to the embodiment 2 includes substantially the same steps as the method of manufacturing a semiconductor device according to the embodiment 1 except for the composition of the resist glass layer. Accordingly, the method of manufacturing a semiconductor device according to the embodiment 2 can acquire advantageous effects which correspond to advantageous effects among advantageous effects which can be acquired by the method of manufacturing a semiconductor device according to the embodiment 1.

Embodiment 3

A method of manufacturing a semiconductor device according to an embodiment 3 basically includes substantially the same steps as the method of manufacturing a semiconductor device according to the embodiment 1. However, the method of manufacturing a semiconductor device according to the embodiment 3 differs from the method of manufacturing a semiconductor device according to the embodiment 1 with respect to a point that a semiconductor device to be manufactured is a planar-type semiconductor device. That is, as shown in FIG. 4A to FIG. 4D and FIG. 5A to FIG. 5D, in the method of manufacturing a semiconductor device according to the embodiment 3, a semiconductor device to be manufactured is a planar-type semiconductor device (pn diode) which includes a semiconductor substrate having a pn junction exposure portion where a pn junction is exposed on a surface of the semiconductor substrate.

In the method of manufacturing a semiconductor device according to the embodiment 3, as shown in FIG. 4A to FIG. 4D and FIG. 5A to FIG. 5D, "semiconductor substrate preparing step", "p$^+$ type semiconductor layer forming step", "n$^+$ type semiconductor layer forming step", "oxide film forming step", "oxide film removing step", "electrode forming step" and "semiconductor substrate cutting step" are performed in this order. Hereinafter, the method of manufacturing a semiconductor device according to the embodiment 3 is described in the order of these steps.

(a) Semiconductor Substrate Preparing Step

Figure 4A:
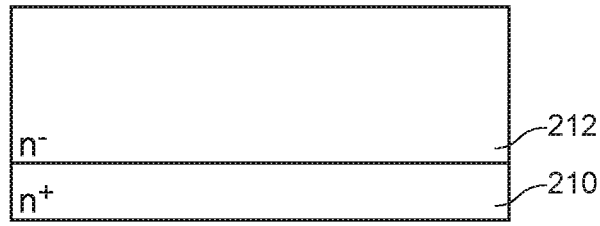
FIG. 4A to FIG. 4D are views for describing a method of manufacturing a semiconductor device according to an embodiment 2, and are also views showing respective steps of the method of manufacturing a semiconductor device.
Figure 4B:
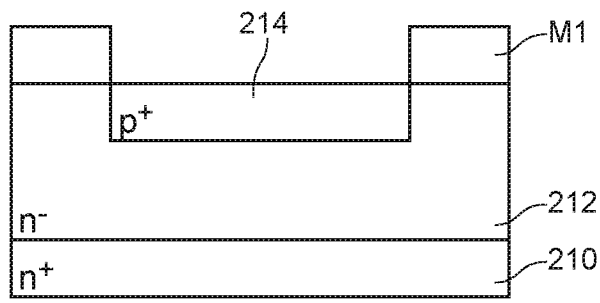
Figure 4C:
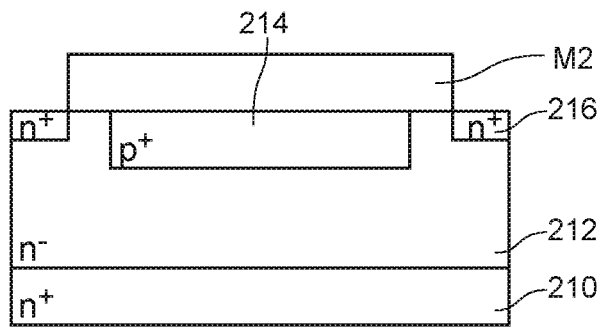

First, a semiconductor substrate where an n$^-$ type semiconductor layer (n$^-$ type epitaxial layer) 212 is laminated on an n$^+$ type semiconductor layer (n$^+$ type silicon substrate) 210 is prepared (see FIG. 4A).

(b) p$^+$ Type Semiconductor Layer Forming Step Next, a mask M1 is formed on the n$^-$ type semiconductor layer 212 and, thereafter, a p type dopant (boron ion, for example) is injected into a predetermined region of a surface of the n$^-$ type semiconductor layer 212 by an ion implantation method using the mask M1. Then, a p$^+$ type semiconductor layer 214 is formed by thermal diffusion (see FIG. 4B). At this stage of operation, a pn junction exposure portion is formed on a surface of the semiconductor substrate.

(c) n$^+$ Type Semiconductor Layer Forming Step

Next, the mask M1 is removed from the n$^-$ type semiconductor layer 212 and a mask M2 is formed on the n$^-$ type semiconductor layer 212. Thereafter, an n type dopant (arsenic ion, for example) is injected into a predetermined region of the surface of the n$^-$ type semiconductor layer 212 by an ion implantation method using the mask M2. Then, an n$^+$ type semiconductor layer 216 is formed by thermal diffusion (see FIG. 4C).

(d) Oxide Film Forming Step

Figure 4D:
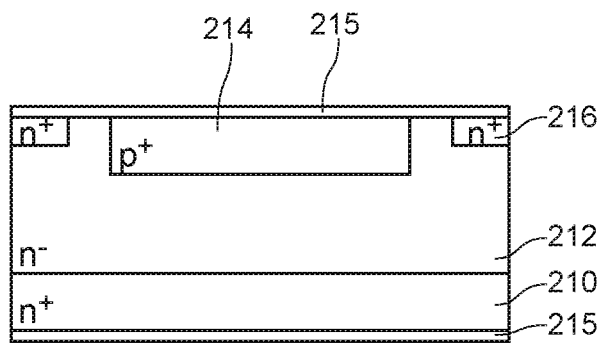

Next, the mask M2 is removed from the n$^-$ type semiconductor layer 212 and, thereafter, an oxide film 215 formed of a silicon oxide film is formed on the surface of the n$^-$ type epitaxial layer 212 (and a back surface of the n$^+$ type silicon substrate 210) by a thermal oxidation method using dry oxygen (DryO$_2$) (see FIG. 4D). A thickness of the oxide film 215 is set to a value which falls within a range of from 5 nm to 100 nm (20 nm, for example). The oxide film 215 is formed such that the semiconductor substrate is put into a diffusion furnace and, thereafter, treatment is applied to the semiconductor substrate at a temperature of 900° C. for 10 minutes while supplying an oxygen gas. When a thickness of the oxide film 215 is less than 5 nm, there may be a case where a semiconductor device to be manufactured cannot acquire an advantageous effect of lowering a reverse current.

(e) Oxide Film Removing Step

Next, the oxide film 215 formed on the surface of the semiconductor substrate is partially removed. The oxide film removing step includes: a first step where a resist glass layer 217 is selectively formed on an upper surface of the oxide film 215 without using an exposure step; a second step where the resist glass layer 217 is densified by baking the resist glass layer 217; and a third step where the oxide film 215 is partially removed using the resist glass layer 217 as a mask. The method does not include a step of removing the resist glass layer 217 after the oxide film removing step.

(e-1) First Step

Figure 5A:
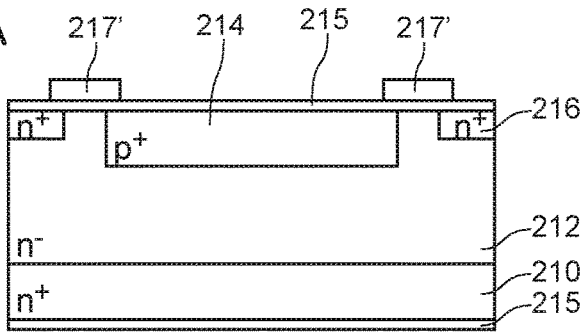
FIG. 5A to FIG. 5D are views for describing the method of manufacturing a semiconductor device according to the embodiment 2, and are also views showing respective steps of the method of manufacturing a semiconductor device.

First, the resist glass layer 217 is formed by a screen printing method on a region of the upper surface of the oxide film 215 which covers the pn junction exposure portion by way of the oxide film 215 without using an exposure step (see FIG. 5A).

(e-2) Second Step

Figure 5B:
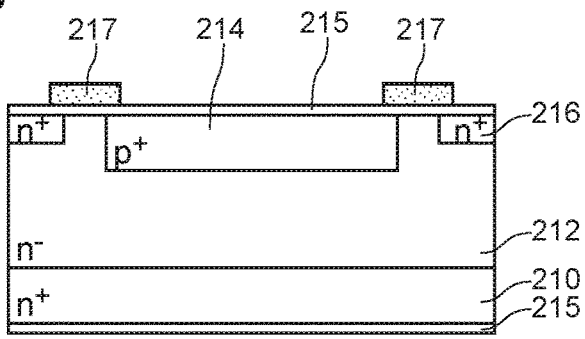

Next, the resist glass layer 217 is densified by baking the resist glass layer 217 under a predetermined temperature condition (see FIG. 5B).

(e-3) Third Step

Figure 5C:
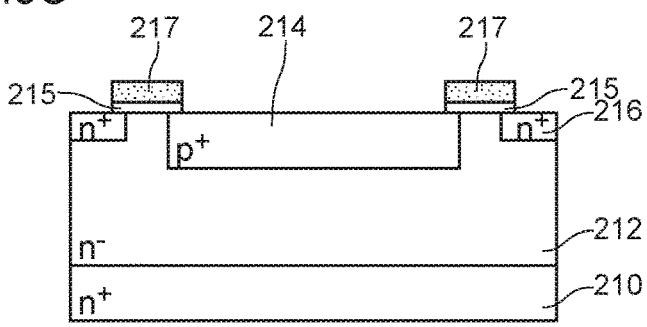

Next, the oxide film 215 is partially removed using the resist glass layer 217 as a mask (see FIG. 5C). In the third step, the oxide film 215 is removed using an etchant containing hydrofluoric acid (for example, buffered hydrofluoric acid).

(f) Electrode Forming Step

Figure 5D:
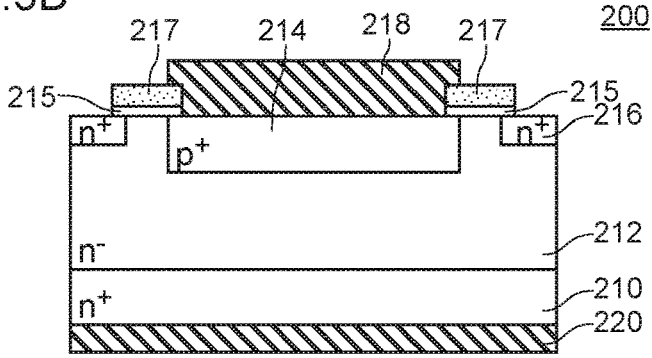

Next, an anode electrode 218 is formed on a region of the surface of the semiconductor substrate from which the oxide film 215 is removed, and a cathode electrode 220 is formed on a back surface of the semiconductor substrate (see FIG. 5D).

(g) Semiconductor Substrate Cutting Step

Next, the semiconductor substrate is cut by dicing or the like so that the semiconductor substrate is divided into a plurality of chips thus manufacturing semiconductor devices 200 (not shown in the drawing).

Through the above-mentioned steps, a planar-type semiconductor device (semiconductor device in the embodiment 3) 200 having high reliability can be manufactured.

As described above, the method of manufacturing a semiconductor device according to the embodiment 3 differs from the method of manufacturing a semiconductor device according to the embodiment 1 with respect to a point that a semiconductor device to be manufactured is not a mesa-type semiconductor device but is a planar-type semiconductor device. However, in the same manner as the method of manufacturing a semiconductor device according to the embodiment 1, the resist glass layer 217 is made of the above-mentioned resist glass (that is, the resist glass which does not substantially contain Zn). Accordingly, it is possible to form the resist glass layer which exhibits high resistance against an etchant. As a result, the method of manufacturing a semiconductor device according to the embodiment 3 becomes a method of manufacturing a semiconductor device which can minimize the occurrence of drawbacks such as the exposure of silicon during the oxide film removing step.

According to the method of manufacturing a semiconductor device of the embodiment 3, the resist glass layer 217 is made of the above-mentioned resist glass. Accordingly, the resist glass layer 217 can be used as a glass layer for passivation as it is during the oxide film removing step and hence, a step of removing the resist glass layer 217 becomes unnecessary. As a result, a semiconductor device can be manufactured with high productivity.

As a result, according to the method of manufacturing a semiconductor device of the embodiment 3, the occurrence of drawbacks such as the exposure of silicon can be minimized during the oxide film removing step, and a semiconductor device can be manufactured with high productivity.

The method of manufacturing a semiconductor device according to the embodiment 3 includes substantially the same steps as the method of manufacturing a semiconductor device according to the embodiment 1 except for the point that a semiconductor device to be manufactured is not a mesa-type semiconductor device but is a planar-type semiconductor device. Accordingly, the method of manufacturing a semiconductor device according to the embodiment 3 can acquire advantageous effects which correspond to advantageous effects among advantageous effects which can be acquired by the method of manufacturing a semiconductor device according to the embodiment 1.

TEST EXAMPLE

Test Example 1

A test example 1 is a test example prepared so as to confirm that "the resist glass of the present invention can form a resist glass layer which exhibits high resistance against an etchant".
1. Preparation of Specimen
(1) Specimen 1 (Example)

A specimen 1 is prepared as follows. Using resist glass substantially equal to the resist glass according to the embodiment 1, a resist glass layer is formed on a surface of a silicon wafer having a mirror surface by an electrophoresis method. The resist glass layer is baked. Then, the silicon wafer is cut into a size of 10 mm×10 mm thus preparing the specimen 1.
(2) Specimen 2 (Example)

Using resist glass substantially equal to the resist glass according to the embodiment 2, a resist glass layer is formed on a surface of a silicon wafer having a mirror surface by an electrophoresis method. The resist glass layer is baked. Then, the silicon wafer is cut into a size of 10 mm×10 mm thus preparing a specimen 2.
(3) Specimen 3 (Comparison Example)

Using general lead-containing glass, a resist glass layer is formed on a surface of a silicon wafer having a mirror surface by an electrophoresis method. The resist glass layer is baked. Then, the silicon wafer is cut into a size of 10 mm×10 mm thus preparing a specimen 3.
2. Evaluation Method An organic resist having an opening of 4 mmϕ is formed on surfaces of the respective specimens (specimens 1 to 3) on which the resist glass layer is formed. Then, the respective specimens are immersed in a buffered hydrofluoric acid solution (HF:HN4=1:10) for 10 minutes. Thereafter, the organic resists are removed from the respective specimens. A stepped portion between an etched portion and a non-etched portion is measured (at four places) by a depth of focus method. As a result, the evaluation "good" is given when an average value of heights of stepped portion among the measured places is 6.0 µm or less. The evaluation "bad" is given when an average value of heights of stepped portion among the measured places exceeds 6.0 µm.
3. Evaluation Results As can be understood also from FIG. 6, in the specimen 1 (example), an average value of heights of the above-mentioned stepped portion is 1 µm or less. In the specimen 2 (example), an average value of heights of the above-mentioned stepped portion falls within a range of from 1 µm to 2 µm. Accordingly, both the specimen 1 and the specimen 2 satisfy an evaluation criterion so that the evaluation "good" is given to the specimen 1 and the specimen 2. On the other hand, in the specimen 3 (comparison example), the average value of heights of the above-mentioned stepped portion falls within a range of from 12 to 15 µm so that the evaluation "bad" is given to the specimen 3.

From the evaluation results, it can be confirmed that "the resist glass of the present invention can form a resist glass layer which exhibits high resistance against an etchant". Accordingly, it is understood that "the resist glass of the present invention is resist glass which can minimize the occurrence of drawbacks such as the exposure of silicon during the oxide film removing step when the resist glass of the present invention is used during the steps of manufacturing a semiconductor device".

Test Example 2

A test example 2 is a test example prepared so as to confirm that "with the use of the resist glass of the present invention during the steps of manufacturing a semiconductor device, a resist glass layer can be used as a glass layer for passivation as it is".

1. Preparation of Specimens

Raw materials are prepared at composition ratios indicated in specimens 4 to 7 (examples) and specimens 8 to 10 (comparison examples) (see FIG. 7). These raw materials are sufficiently mixed and stirred together by a mixer. Thereafter, the mixed raw material is put into a platinum crucible. A temperature of the mixed raw material is elevated up to a predetermined temperature (1350° C. to 1550° C.) in an electric furnace, and the mixed raw material is melted for two hours. Then, the material in a molten state is made to flow out from the crucible and is fed to water-cooled rolls so that glass flakes in a flaky shape are obtained. The glass flakes are pulverized by a ball mill until the glass flakes obtain an average particle size of 5 μm thus obtaining powdery resist glass.

The raw materials used in the specimens 4 to 7 (examples) are $SiO_2$, $H_3BO_3$, $Al_2O_3$, ZnO, $CaCO_3$, $BaCO_3$, MgO, NiO and $ZrO_2$.

2. Evaluation

The respective resist glasses obtained by the above-mentioned method are evaluated in accordance with the following evaluation aspects.

(1) Evaluation Aspect 1 (Baking Temperature)

Resist glass layers are formed using the respective resist glasses. Temperatures at which the resist glass layers are densified by being baked (baking temperatures) are measured. When the baking temperature is excessively high, the baking temperature largely influences a semiconductor device in a manufacturing process. Accordingly, the evaluation "good" is given when the baking temperature is equal to or below 1000° C., and the evaluation "bad" is given when the baking temperature exceeds 1000° C.

(2) Evaluation Aspect 2 (Chemical Resistance)

The evaluation "good" is given when the resist glass exhibits insolubility with respect to all of aqua regia, plating liquid and hydrofluoric acid, and the evaluation "bad" is given when the resist glass exhibits solubility with respect to at least one of aqua regia, plating liquid and hydrofluoric acid. A test for checking whether or not the resist glass exhibits insolubility with respect to hydrofluoric acid is carried out by the following two test methods (test methods 1 and 2).

(2-1) Test Method 1

Test pieces are prepared as follows. Using the respective resist glasses, resist glass layers are formed on surfaces of silicon wafers having a mirror surface by an electrophoresis method. The resist glass layers are baked. Then, the respective silicon wafers are cut into a size of 10 mm×10 mm thus preparing the test pieces. Thereafter, the respective test pieces are immersed in hydrofluoric acid (6%) for 5 minutes. A change in weight of the respective test pieces between before and after the immersion is measured.

(2-2) Test Method 2

Test pieces are prepared as follows. Using the respective resist glasses, resist glass layers are formed on surfaces of silicon wafers having a mirror surface by an electrophoresis method. The resist glass layers are baked. Then, the respective silicon wafers are cut into a size of 10 mm×10 mm thus preparing specimens. Thereafter, an organic resist having an opening of 4 mmφ is formed on surfaces of these specimens on which the resist glass layer is formed thus preparing the test pieces. Then, the respective test pieces are immersed in a hydrofluoric acid (6%) for 5 minutes. Thereafter, the organic resist is removed. A stepped portion between an etched portion and a non-etched portion is measured (at four places) by a depth of focus method.

(2-3) Evaluation Based on Evaluation Aspect 2

The evaluation "good" is given when a change in weight of the test piece is 2.0 mg or less in the test method 1, and an average value of heights of stepped portion measured at four places is 6.0 μm or less in the test method 2. The evaluation "bad" is given at least either when a change in weight of the test piece exceeds 2.0 mg in the test method 1 or when an average value of heights of stepped portion measured at four places exceeds 6.0 μm in the test method 2.

(3) Evaluation Aspect 3 (Average Linear Expansion Coefficient)

Resist glass plates in a flaky shape are prepared from resist glass in a molten state prepared by the method described in the above-mentioned "1. Preparation of specimens". An average linear expansion coefficient of the resist glass at a temperature of 50° C. to 550° C. is measured by using the resist glass plates in a flaky shape. The average linear expansion coefficient is measured by a total expansion measuring method (temperature elevation speed: 10° C./min) using Thermomechanical Analyzers TMA-60 made by SHIMADZU CORP. In the measurement, silicon single crystal having a length of 20 mm is used as a standard specimen. As the result of the measurement, the evaluation "good" is given when a difference between the average linear expansion coefficient of the resist glass at a temperature of 50° C. to 550° C. and a linear expansion coefficient ($3.73 \times 10^{-6}$ of silicon is "$0.5 \times 10^{-6}$" or less, and the evaluation "bad" is given when the difference exceeds "$0.5 \times 10^{-6}$". In the column of the evaluation aspect 4 in FIG. 7, numerals in parentheses indicate values of average linear expansion coefficients ($\times 10^{-6}$) of the resist glass at a temperature of 50° C. to 550° C.

(4) Evaluation Aspect 4 (Insulation Property)

Figure 8A:
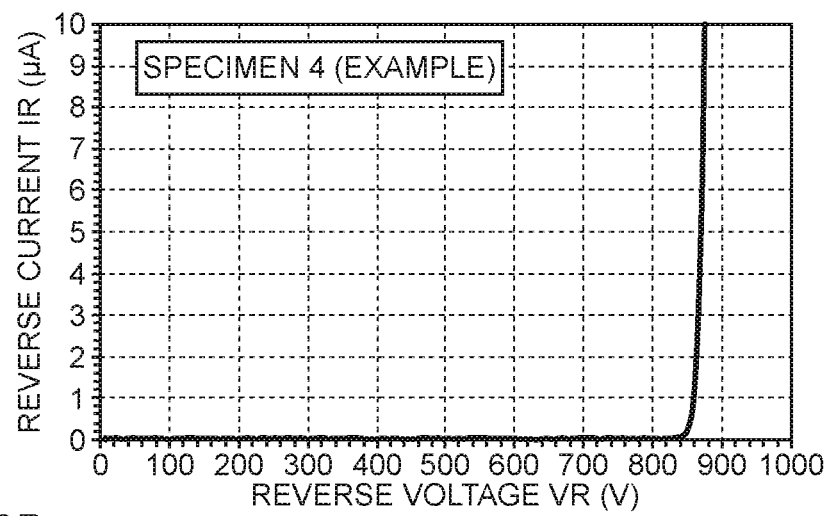
Figure 8B:
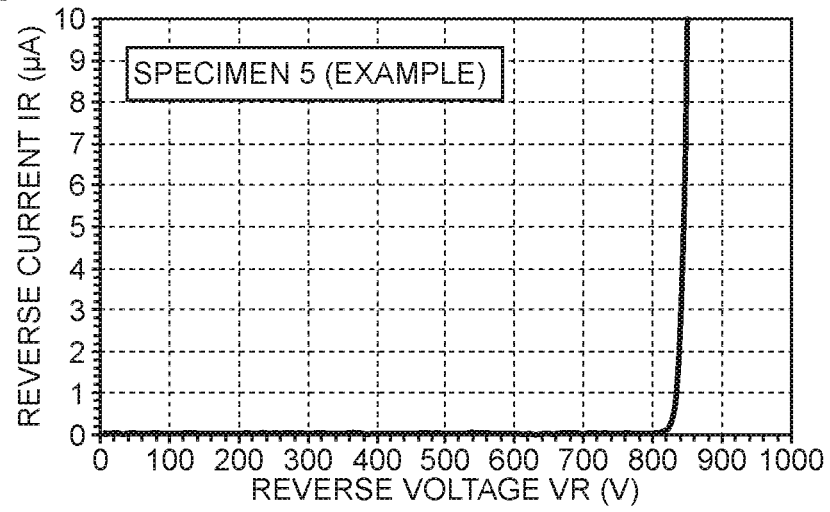

Semiconductor devices (pn diodes) having a withstand voltage of 600V are prepared by a method substantially equal to the method of manufacturing a semiconductor device according to the embodiment 1 except for that resist glasses of the specimens 4 to 10 are used as resist glass. Reverse voltage characteristics of the manufactured semiconductor devices are measured (see FIG. 8A and FIG. 8B with respect to the specimens 4 and 5). With respect to the specimen 7 (example), an insulating film (thermal oxide film) is formed on an inner surface of a trench and, thereafter, a resist glass layer is formed on the insulating film. With respect to the specimens 8 to 10 (comparison examples), an oxide film is removed by using a photoresist layer formed on a resist glass layer as a mask instead of using the resist glass layer as a mask. As the result of the measurement, the evaluation "good" is given when a reverse voltage characteristic of a semiconductor device falls within a normal range, and the evaluation "bad" is given when a reverse voltage characteristic of a semiconductor device falls outside the normal range.

(5) Comprehensive Evaluation

The evaluation "good" is given to the resist glass when all of the above-mentioned evaluation aspects 1 to 4 have the evaluation "good", and the evaluation "bad" is given to the resist glass when at least one of the respective evaluation aspects 1 to 4 has the evaluation "bad".

3. Evaluation Result

As can be understood also from FIG. 7, the evaluation "bad" is given to all resist glasses according to the specimens 8 to 10 (comparison examples) with respect to at least one of the evaluation aspects so that the evaluation "bad" is given to all resist glasses according to the specimens 8 to 10 as the comprehensive evaluation. That is, the evaluation "bad" is given to the resist glasses according to the specimens 8 to 10 (comparison examples) with respect to the evaluation aspect 2. The evaluation "bad" is given to the resist glass according to the specimen 9 (comparison example) also with respect to the evaluation aspect 3.

To the contrary, the evaluation "good" is given to all resist glasses according to the specimens 4 to 7 (examples) with respect to all evaluation aspects (evaluation aspects 1 to 4). As the result, it is found that all resist glasses according to the specimens 4 to 7 (examples) are resist glasses which satisfy all conditions as glass for passivation. That is, all resist glasses according to the specimens 4 to 7 satisfy the condition (a) that the resist glass can be baked at a proper temperature (for example, 1000° C. or below), the condition (b) that the resist glasses exhibit resistance against chemicals used in steps, the condition (c) that the resist glass has a linear expansion coefficient close to a linear expansion coefficient of silicon (particularly an average linear expansion coefficient at a temperature of 50° C. to 550° C. being close to a linear expansion coefficient of silicon), and the condition (d) that the resist glass has excellent insulation property.

From the evaluation results, it can be confirmed that "with the use of the resist glass of the present invention during the steps of manufacturing a semiconductor device, a resist glass layer can be used as a glass layer for passivation as it is". Accordingly, a step of removing the resist glass layer becomes unnecessary and hence, it is understood that the resist glass of the present invention is resist glass which enables the manufacture of a semiconductor device with high productivity.

Although the present invention has been described heretofore in conjunction with the above-mentioned embodiments, the present invention is not limited to the above-mentioned embodiments, and can be carried out in various modes without departing from the gist of the present invention. For example, the following modifications are also conceivable.

(1) The numbers, materials, shapes, positions, sizes and the like of the constitutional elements described in the above-mentioned embodiment are merely examples, and can be changed within a range that the advantageous effects of the present invention effect is not impaired.

(2) In the above-mentioned embodiment 3, the resist glass according to the embodiment 1 (that is, the resist glass which does not substantially contain Zn) is used. However, the present invention is not limited to such a configuration. For example, the resist glass according to the embodiment 2 (that is, the resist glass where the content of ZnO falls within a range of from 4 mol % to 14 mol %) may be used.

(3) The resist glass layer is formed by an electrophoresis method in the above-mentioned embodiment 1, and the resist glass layer is formed using a screen printing method in the above-mentioned embodiment 3. However, the present invention is not limited to such a configuration. The resist glass layer may be formed by another suitable method (for example, a spin coating method, a doctor blade method or other methods of forming a resist glass layer).

(4) In the above-mentioned embodiment 1, the resist glass layer is directly formed on the inner surface of the trench. However, the present invention is not limited to such a configuration. For example, the configuration may be adopted where the insulating film (thermal oxide film) is formed on the inner surface of the trench and, then, the resist glass layer is formed on the insulating film. In this case, the insulating film having higher wettability than the semiconductor substrate is interposed between the semiconductor substrate and the resist glass layer and hence, it is possible to minimize the generation of bubbles from a boundary surface between the semiconductor substrate and the resist glass layer in a step of baking the resist glass layer. Accordingly, such generation of bubbles can be suppressed without adding a component having defoaming property such as a nickel oxide or with the addition of a small amount (2.0 mol % or less, for example) of such a component having defoaming property even if the component is added.

(5) In the above-mentioned respective embodiments, the present invention has been described by taking the method of manufacturing diodes (the mesa-type pn diode and the planar-type pn diode) as examples. However, the present invention is not limited to such diodes. The present invention is also applicable to methods of manufacturing a semiconductor device other than a diode (for example, thyristor, power MOSFET, IGBT and the like).

(6) In the above-mentioned respective embodiments, the silicon substrate is used as the semiconductor substrate. However, the present invention is not limited to such a configuration. For example, a semiconductor substrate such as a SiC substrate, a GaN substrate or a GaO substrate may also be used.

REFERENCE SIGNS LIST

100, 200, 900: semiconductor device
110, 910: $n^-$ type semiconductor substrate
112, 912: $p^+$ type diffusion layer
114, 914: $n^-$ type diffusion layer
116, 118, 215, 916, 918: oxide film
120, 920: trench
122, 217: resist glass layer
130, 930: region where Ni plating electrode film is to be formed
132, 932: roughened surface region
134, 934: anode electrode
136, 936: cathode electrode
210: $n^+$ type semiconductor substrate
212: $n^-$ type epitaxial layer
214: $p^+$ type diffusion layer
216: $n^+$ type diffusion layer
218: anode electrode layer
220: cathode electrode layer

The invention claimed is:

1. A method of manufacturing a semiconductor device comprising an oxide film removing step where an oxide film formed on a surface of a semiconductor substrate is partially removed, wherein the oxide film removing step comprises:
a first step where a resist glass layer is selectively formed on an upper surface of the oxide film without using an exposure step;
a second step where the resist glass layer is densified by baking the resist glass layer; and
a third step where the oxide film is partially removed using the resist glass layer as a mask, wherein the resist glass layer contains at least $SiO_2$, $B_2O_3$, $Al_2O_3$, ZnO, and at least two oxides of alkaline earth metals selected from a group consisting of CaO, MgO and BaO, and substantially contains none of Pb, As, Sb, Li, Na and K, and the content of $SiO_2$ falls within a range of from 50 mol % to 65 mol %, the content of $B_2O_3$ falls within a range of from 8 mol % to 18 mol %, the content of $Al_2O_3$ falls within a range of from 4 mol % to 15 mol %, the content of ZnO falls within a range of from 4 mol % to 14 mol %, and the content of the oxide of the alkaline earth metal falls within a range of from 6 mol % to 16 mol %, wherein in the first step, the resist glass layer which does not substantially contain Pb is formed on a partial region of an upper surface of the oxide film, in the third step, the oxide film is removed by an etchant containing a hydrofluoric acid using the resist glass as a mask, and no additional layer is formed on top of the resist glass layer in the oxide film removing step, the method further comprises an electrode forming step where an electrode is formed in the region where the oxide film is removed in the third step after the oxide film removing step but does not include a step of removing the resist glass layer after the oxide film removing step.

2. The method of manufacturing a semiconductor device according to claim 1, wherein the method further comprises in the following order before the oxide film removing step:

a semiconductor substrate preparing step where a semiconductor substrate having a pn junction parallel to a main surface thereof and having the main surface thereof covered by an oxide film is prepared; and a trench forming step where a pn junction exposure portion is formed in the inside of the trench by forming the trench having a depth exceeding the pn junction from one main surface of the semiconductor substrate, wherein in the first step, the resist glass layer is formed on a region of an upper surface of the oxide film around the trench and on an inner surface of the trench by an electrophoresis method.

3. The method of manufacturing a semiconductor device according to claim 1, wherein the method further comprises in the following order before the oxide film removing step:

a step where the semiconductor substrate which has a pn junction exposure portion where a pn junction is exposed on a surface thereof is prepared; and a step where the oxide film is formed on the surface of the semiconductor substrate, wherein in the first step, the resist glass layer is formed in a region of an upper surface of the oxide film which covers the pn junction exposure portion by way of the oxide film by a screen printing method.

* * * * *